US007554471B2

(12) United States Patent
Tsai et al.

(10) Patent No.: US 7,554,471 B2
(45) Date of Patent: Jun. 30, 2009

(54) SYSTEM AND METHOD FOR IMPROVING LINEARITY OF A DAC

(75) Inventors: Kenneth Kung-Juh Tsai, Palos Verde Estates, CA (US); John Chan Phan, Garden Grove, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 11/591,231

(22) Filed: Nov. 1, 2006

(65) Prior Publication Data

US 2008/0100487 A1 May 1, 2008

(51) Int. Cl.
*H03M 1/20* (2006.01)
(52) U.S. Cl. ...................................... 341/131
(58) Field of Classification Search ................. 341/131; 708/250–256, 270–276
See application file for complete search history.

(56) References Cited

U.S. PATENT DOCUMENTS

| 4,855,944 | A | * | 8/1989 | Hart ............................ 708/252 |
| 4,901,265 | A | * | 2/1990 | Kerr et al. .................... 708/276 |
| 4,994,803 | A | | 2/1991 | Blackham |
| 5,012,242 | A | * | 4/1991 | Yoshio et al. ................ 341/131 |
| 5,014,231 | A | * | 5/1991 | Reinhardt et al. ........... 708/276 |
| 5,073,777 | A | * | 12/1991 | Fukuhara et al. ............ 341/131 |
| 5,148,163 | A | * | 9/1992 | Frindle ........................ 341/131 |
| 5,291,428 | A | * | 3/1994 | Twitchell et al. ............ 708/276 |
| 5,459,680 | A | | 10/1995 | Zimmerman et al. |
| 5,497,154 | A | * | 3/1996 | Komamura .................. 341/131 |
| 5,598,440 | A | * | 1/1997 | Domagala .................... 375/329 |
| 6,268,814 | B1 | * | 7/2001 | Kolsrud ....................... 341/131 |
| 2002/0057733 | A1 | * | 5/2002 | Sullivan ..................... 375/222 |
| 2004/0013179 | A1 | * | 1/2004 | Cheng et al. ................. 375/219 |

OTHER PUBLICATIONS

Vankka, J., Spur Reduction Techniques in Sine Output Direct Digital Synthesis, Proceedings of the 1996 IEEE International Frequency Control Symposium, Jun. 5-7, 1996, pp. 951-959, Honolulu, HI., USA.*

* cited by examiner

*Primary Examiner*—Howard Williams
(74) *Attorney, Agent, or Firm*—Tarolli, Sundheim, Covell & Tummino LLP

(57) ABSTRACT

A system and method for improving the linearity of a digital-to-analog converter (DAC) is provided. In one embodiment, the system comprises a digital waveform generator that generates a digital sequence associated with a desired analog waveform and a pseudo-random noise component that provides a pulse shaped band limited pseudo-random noise sequence. The system further includes a combiner configured to combine the digital sequence and the pulse shaped band limited pseudo-random noise sequence and provide the combined sequence to the DAC.

14 Claims, 6 Drawing Sheets

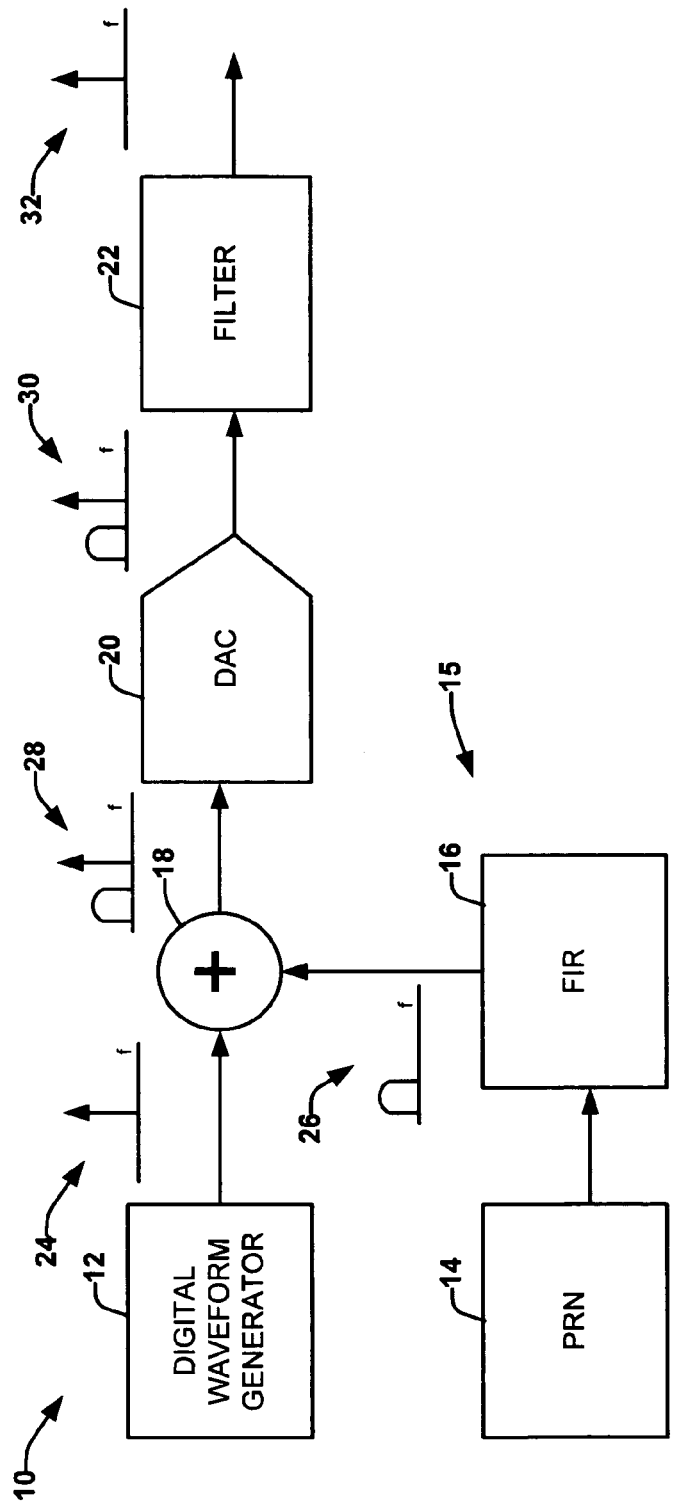
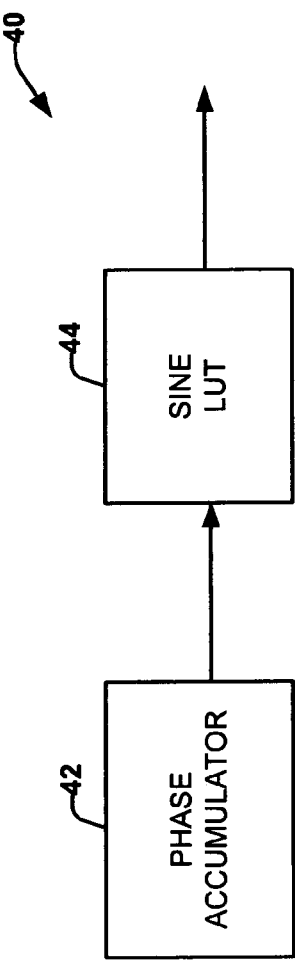
FIG. 1
FIG. 2

SYSTEM AND METHOD FOR IMPROVING LINEARITY OF A DAC

This invention was made with Government support under Contract No. FA 8808-04-C-0023. The Government has certain rights in this invention.

TECHNICAL FIELD

The present invention relates generally to electronics, and more particularly to a system and method for improving linearity of a digital-to-analog converter (DAC).

BACKGROUND

Digital-to-analog converters (DACs) find application in a variety of different electronic applications. Typically, DACs have inherent non-linearity and distortions that cause spurious harmonics at the output of the analog waveform. In some applications, it is important that the conversion from the digital domain to the analog be highly accurate. For example, signal analysis instruments and signal waveform output systems need to produce highly accurate analog excitation signals from corresponding digital signal data. In most such applications, conversion errors referred to as distortion are a function of the input digital data and the non-linearity of the DAC are much more important than errors that are uncorrelated, referred to as noise. The noise portion of any conversion error can be reduced by averaging the waveform over time. The distortion portion of the error, however, cannot.

To achieve low distortion digital-to-analog conversion, high precision DACs have been fabricated with finely matched components. An alternative approach is to quantify the distortion error of a particular converter at all possible input signal conditions and then to implement a correction circuit that compensates for the circuit's known error. These approaches, however, are expensive and unsuitable for large volume production.

SUMMARY

In one aspect of the invention, a system for improving the linearity of a digital-to-analog converter (DAC) is provided. The system may comprise a digital waveform generator that generates a digital sequence associated with a desired analog waveform and a pseudo-random noise component that provides a pulse shaped band limited pseudo-random noise sequence. The system may further comprise a combiner configured to combine the digital sequence and the pulse shaped band limited pseudo-random noise sequence and provide the combined sequence to the DAC.

In another aspect of the invention, a system is provided for removing spurious harmonics from an analog waveform output from a DAC. The system may comprise means for generating a digital sequence associated with a desired analog waveform, means for providing a pulse shaped band limited pseudo-random noise sequence, and means for combining the digital sequence and the pulse shaped band limited pseudo-random noise sequence to provide the combined sequence to the DAC.

In yet another aspect of the invention, a method is provided for improving the linearity of a DAC. The method may comprise generating a digital sequence associated with a desired analog waveform, providing a pulse shaped band limited pseudo-random noise sequence, combining the digital sequence and the pulse shaped band limited pseudo-random noise sequence, and providing the combined sequence to the DAC.

BRIEF DESCRIPTION OF THE DRAWINGS

FIG. 1 illustrates a block diagram of a system for improving linearity of a DAC in accordance with an aspect of the present invention.

FIG. 2 illustrates an exemplary digital waveform generator in accordance with an aspect of the invention.

DETAILED DESCRIPTION

Figure 3:
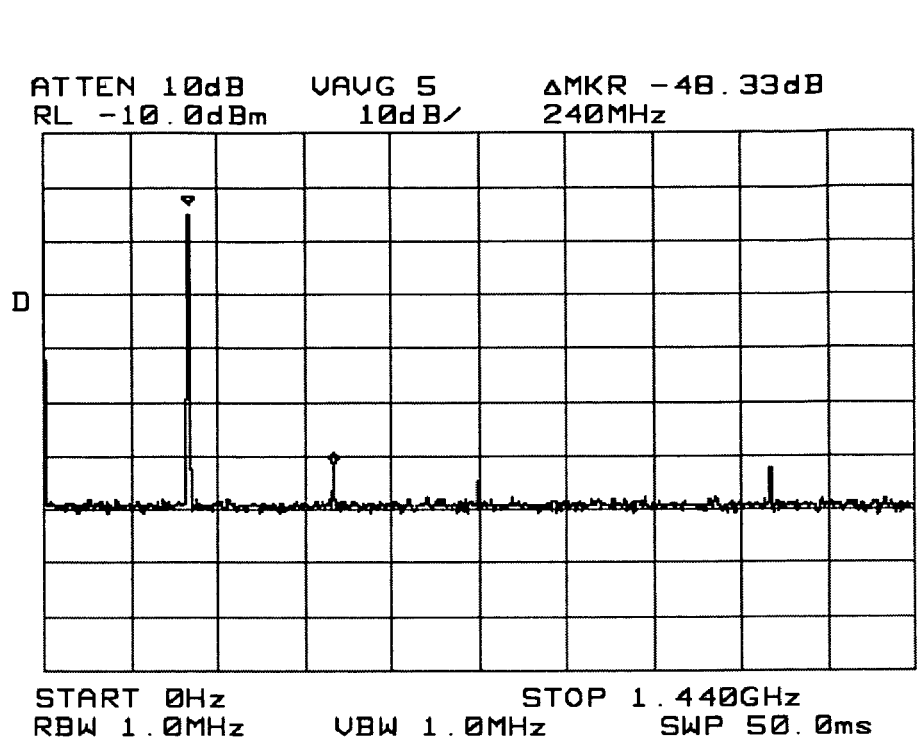
FIG. 3 illustrates a graph of spectral power level versus frequency of an output signal of an exemplary DAC without pulsed shaped pseudo-random noise injection.

The present invention relates to a system and method for improving linearity of a DAC. The system and method employ an injection of band limited pulse shaped pseudo-random noise into a digital waveform input signal to cause the non-linearity of the DAC to be averaged or smoothed out, thus reducing harmonic distortion spurs. The presence of additive random noise forces the conversion of the intended synthesized frequency tone to take place over randomized transitions to avoid the periodic spurious harmonics that cause output errors. Additionally, by proper band limiting and frequency placement of the pseudo-random noise away from the frequency of the signal of interest, the noise can be readily removed from the output signal by filtering that is typically present after an output of the DAC, thus eliminating the need for complicated noise removal circuitry. The present invention can be employed with a variety of different DAC types, ranges and resolutions.

FIG. 1 illustrates a system 10 for improving linearity of a DAC 20 in accordance with an aspect of the present invention. The system 10 can be employed in a variety of application, such as a direct digital synthesis system 10 where the linearity and dynamic range performance is limited by the DAC 20.

The system includes a digital waveform generator 12 that generates sequences of digital words or a synthesized digital sequence representing a digital waveform. The digital waveform is converted into an analog waveform by the DAC 20. The analog waveform can be in the form of a variety of different modulated waveform types over a frequency band of interest. The analog waveform can include harmonic distortion spurs at the output of the DAC 20 due to the non-linearity of the DAC 20. The system 10 employs band limited noise injection, also referred to as pulse shaped band limited noise injection, into the digital input sequence of the DAC 20 to reduce the harmonic output spurs.

The system 10 includes a pseudo-random noise component 15 having a pseudo-random number generator 14 that generates a pseudo-random number sequence to provide a pseudo-random noise sequence and a finite impulse response (FIR) filter 16. The pseudo-random noise sequence is band limited or pulse shaped by the FIR filter 16 to limit the frequency band of the noise sequence to a frequency that is outside the frequency band of interest of the analog output signal. The band limited noise sequence is continuously added to the digital waveform sequence via a summer 18. It is to be appreciated that other techniques for combining the pseudo-random noise sequence with the digital waveform sequence can be employed. Furthermore, the pseudo-random noise sequence can be stored in a memory device such as a random access memory (RAM), read only memory (ROM) or another type of memory device. The pseudo-random noise sequence then can be read from memory in order and combined with the digital waveform sequence.

The digital waveform sequence with band limited noise is provided to the DAC 20 for conversion from the digital domain to the analog domain to provide a modulated analog waveform or analog output signal with substantially reduced harmonic distortion spurs. The modulated analog waveform is provided to a filter 22, which defines the frequency band of interest and removes spectral images outside of the frequency band of interest. It is to be appreciated that the frequency band of the band limited noise can be arbitrarily selected depending on the intended bandwidth of use at the DAC output, such that a tightly controlled band limited noise minimally impacts the output signal. For example, the frequency band of the band limited noise can be selected to be around DC or one half (½) of the sampling frequency, while the frequency of interest can be selected to be from one eighth (⅛) to three eighth (⅜) of the sampling frequency, or any other useful portion of the spectrum. In this manner, the band limited noise can be readily filtered out by the filter 22, typically present for DC-blocking or anti-alias purpose. Additionally, if a DAC includes a differential output, a 180° hybrid can be employed to combine the differential outputs of the DAC into a single ended signal. Furthermore, the transformer coupled nature of a 180° hybrid can introduce a DC-blocking or high pass response in the system 10, partially removing the shaped noise.

A set of frequency graphs illustrate the state of the signals propagating through the systems. A first graph 24 illustrates that the digital waveform generator provides a digital waveform having a frequency tone at a desired frequency of interest. A second graph 26 illustrates a pulse shaped band-limited noise spectrum that is output from the FIR 16 and added to the desired frequency of interest to provide a third graph 28. The third graph 28 illustrates that the pulse shaped band-limited noise spectrum is outside the desired frequency of interest. A fourth graph 30 illustrates that the pulse shaped band-limited noise spectrum is outside the desired frequency of interest after converting the input sequence from the digital to analog domain. A fifth graph 32 illustrates that the band-limited noise spectrum is readily removed from the signal of interest by the filter 22.

FIG. 2 illustrates an exemplary digital waveform generator 40 in accordance with an aspect of the invention. The exemplary digital waveform generator 40 employs a phase accumulator 42 and a sine wave look up table 44 to generate a digital waveform sequence that represents a sine wave of a desired frequency. Other techniques can be employed to generate a sine wave. The generation of a sine wave provides for the most prevalent of spurious harmonics, which can be reduced by injection a pulsed shaped band limited pseudo-random noise sequence in a band outside the desired frequency into the digital waveform sequence, as illustrated in FIG. 1.

Figure 4:
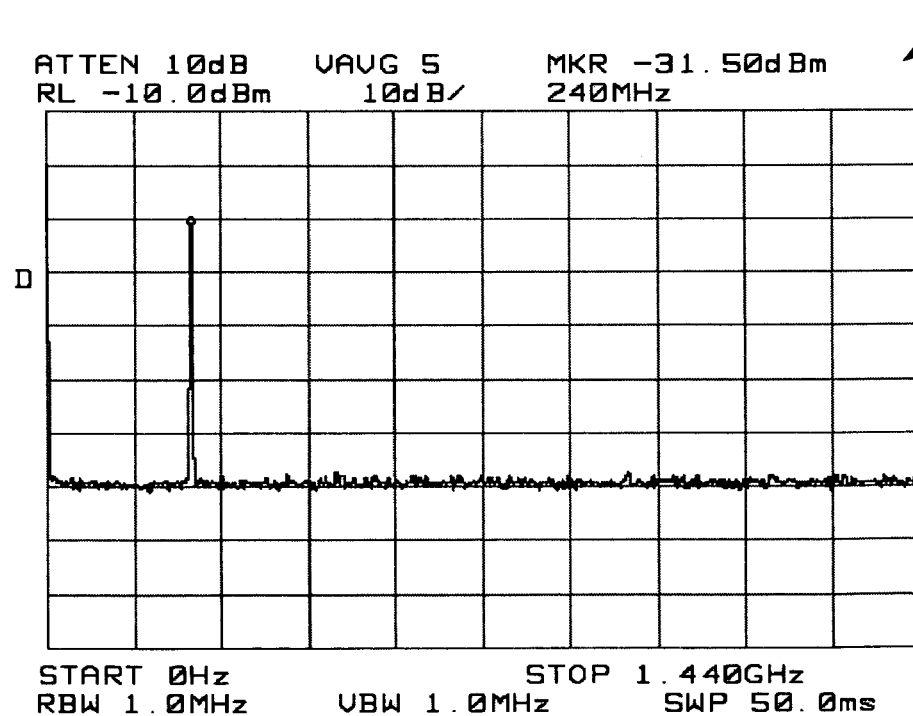
FIG. 4 illustrates a graph of spectral power level versus frequency of an output signal of the same DAC of FIG. 3 with pulse shaped pseudo-random noise injection having a bandwidth of 2.5 MHz at baseband in accordance with an aspect of the invention.

FIG. 3 illustrates a graph 50 of spectral power level versus frequency of an output signal of an exemplary DAC without pulsed shaped pseudo-random noise injection. The exemplary DAC can be, for example, a 10-bit DAC formed of Indium phosphide (InP) 0.8 um heterojunction bipolar transistors (HBTs) with a sampling rate at 2880 Msps provided with a sine wave input signal synthesized with 241 MHz output tone with incurred phase truncation error. The output signal can be observed after being provided to a differential combiner, a low pass filter with a cutoff of 1.2 GHz, an amplifier and coupler. The graph 50 illustrates the presence of 2nd, 3rd and 5th harmonic tones as a result of various imperfections and non-linearity of the DAC circuitry. The dominant spur is at the second harmonic, which from ΔMKR reading is approximately at −48.33 dB below the fundamental tone. FIG. 4 illustrates a graph 60 of spectral power level versus frequency of an output signal of the same DAC of FIG. 3 with pulse shaped pseudo-random noise injection having a bandwidth of 2.5 MHz at baseband. The graph 60 illustrates the substantially reduction of 2nd, 3rd and 5th harmonic tones that appear in the graph of FIG. 3.

Figure 5:
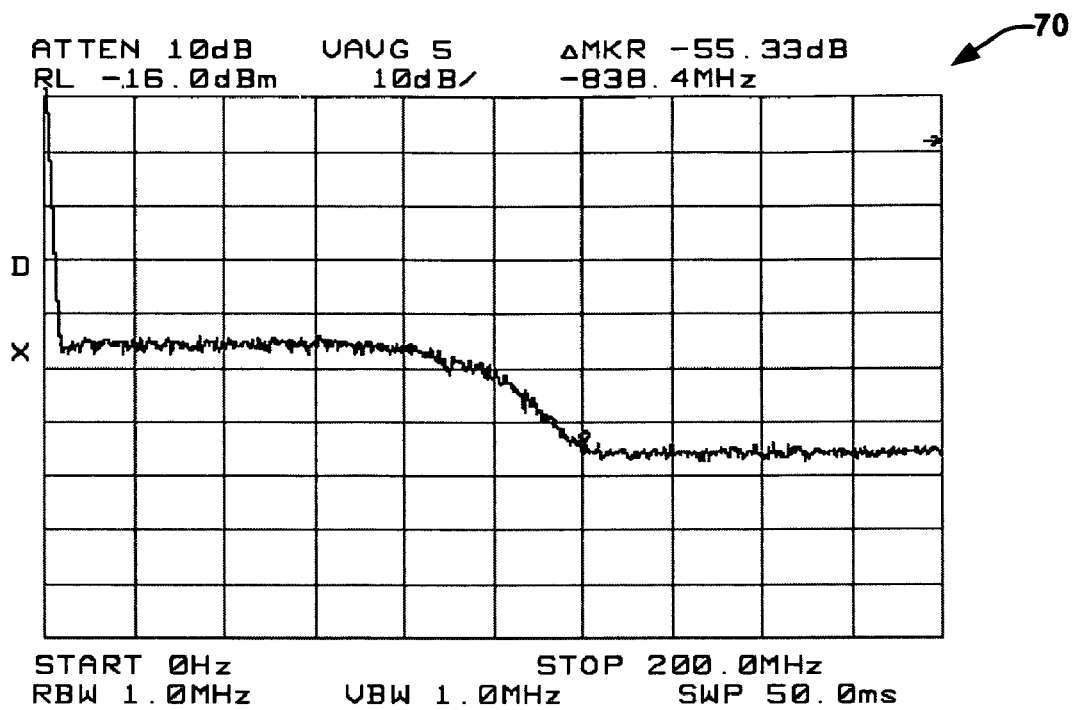
FIG. 5 illustrates a graph of spectral power level versus frequency of a portion of an output signal with pulsed shaped pseudo-random noise injection with a half main lobe band width of 120 MHz measured at the combined differential outputs of the DAC in accordance with an aspect of the invention.

FIG. 5 illustrates a graph 70 of spectral power level versus frequency of a portion of an output signal with pulsed shaped pseudo-random noise injection with a half main lobe band width of 120 MHz. The pulsed shaped pseudo-random noise band is provided employing an 8-bit pseudo-random number generator and a FIR filter with Square Root Raised Cosine (SRRC) pulse shape having an alpha of about 0.33.

Figure 6:
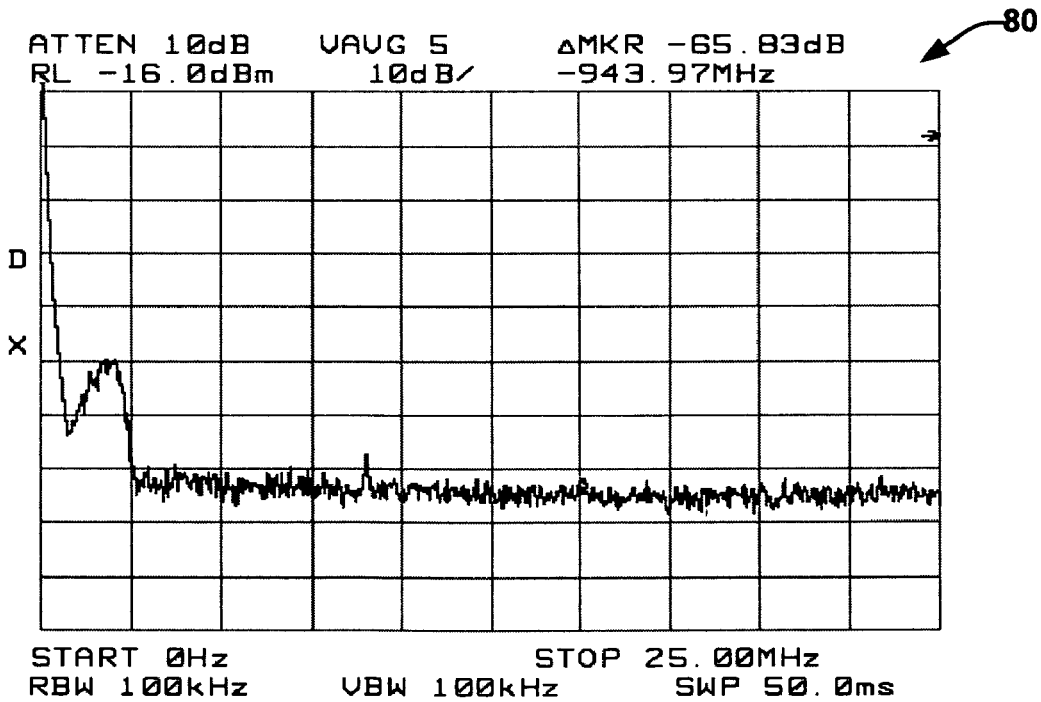
FIG. 6 illustrates a graph of spectral power level versus frequency of a portion of an output signal with pulsed shaped pseudo-random noise injection with a half main lobe band width of 2.5 MHz measured at the combined differential outputs of the DAC in accordance with an aspect of the invention.

FIG. 6 illustrates a graph 80 of spectral power level versus frequency of a portion of an output signal with pulsed shaped pseudo-random noise injection having identical signal power with a half main lobe band width of 2.5 MHz. It was determined that the smaller 2.5 MHz noise band provided substantially similar results as the 120 MHz band, but was more readily removed by a filter at the output of the DAC due to its smaller bandwidth than the 120 MHz band. It is to be appreciated that the 2.5 MHz noise is already partially attenuated by the DC-blocking nature of the 180 degree hybrid combiner employed in the exemplary DAC employed.

Figure 7:
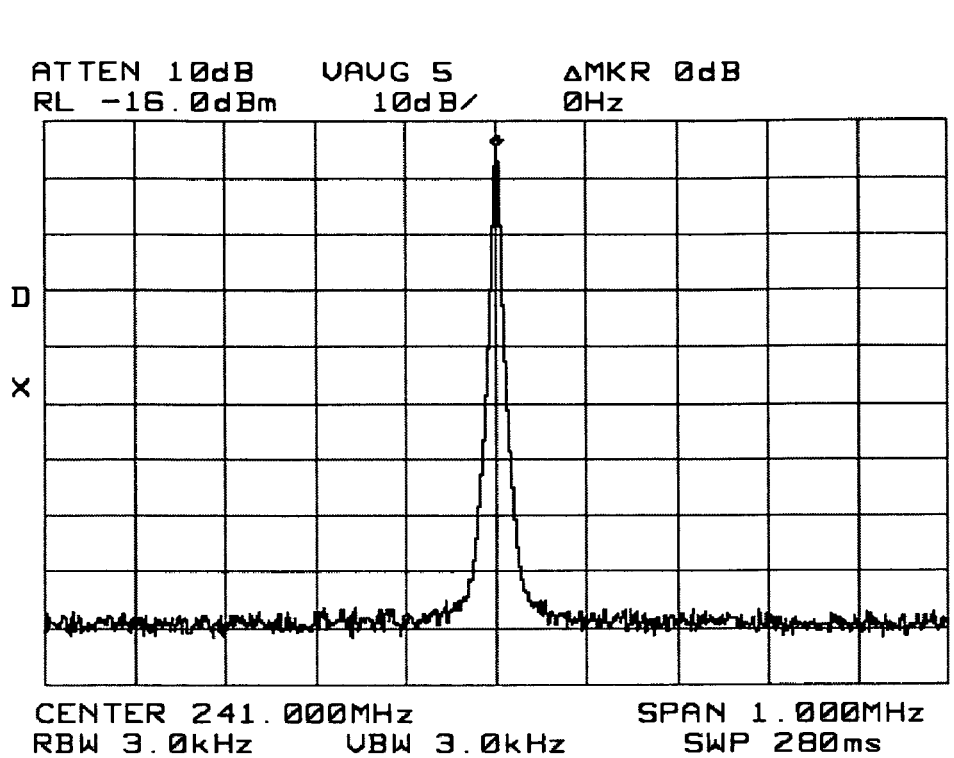
FIG. 7 illustrates a graph of spectral power level versus frequency of the fundamental of an output signal of an exemplary DAC with pulsed shaped pseudo-random noise injection measured at the combined differential outputs of the DAC in accordance with an aspect of the invention.
Figure 8:
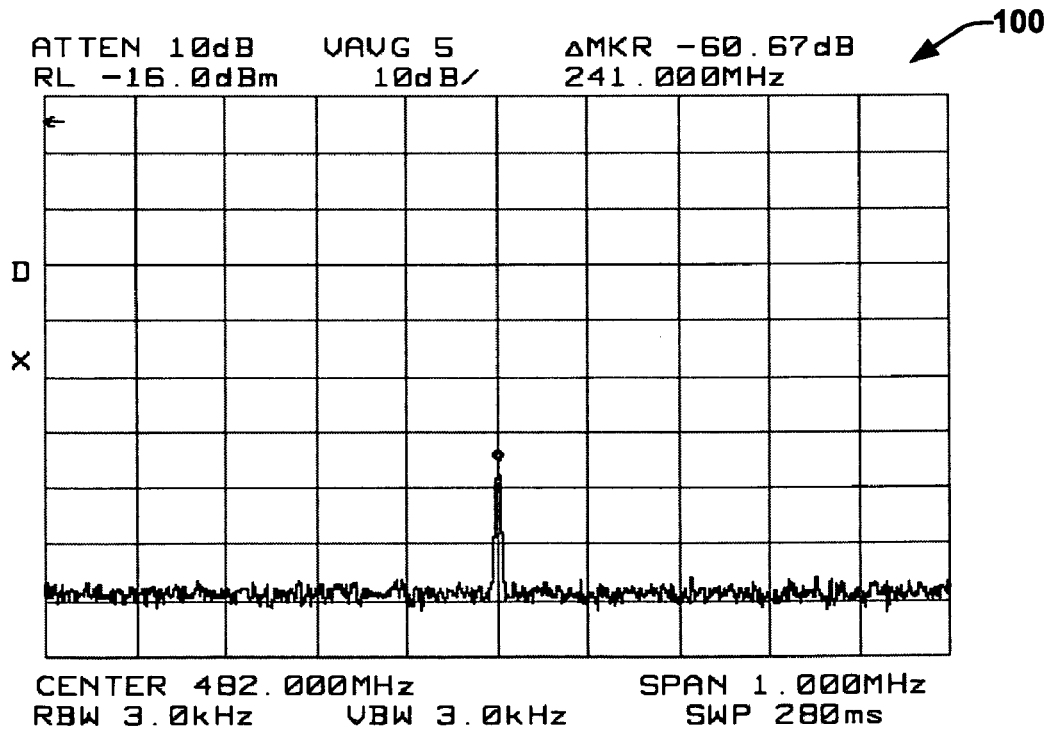
FIG. 8 illustrates a graph of spectral power level versus frequency of a second harmonic of an output signal of the same exemplary DAC of FIG. 7 with pulse shaped pseudo-random noise injection having a bandwidth of 2.5 MHz at baseband in accordance with an aspect of the invention.

FIG. 7 illustrates a graph 90 of spectral power level versus frequency of the fundamental of an output signal of an exemplary DAC with pulsed shaped pseudo-random noise injection. FIG. 8 illustrates a graph 100 of spectral power level versus frequency of a second harmonic of an output signal of the same exemplary DAC of FIG. 7 with pulse shaped pseudo-random noise injection having a bandwidth of 2.5 MHz at baseband. FIG. 7 graph 90 and FIG. 8 graph 100 are higher resolution measurements of the fundamental and second harmonic in FIG. 4 graph 60. The graph 100 of FIG. 8 illustrates an improvement of 10 dB of the second harmonic compared to the graph 50 of FIG. 3. Combined with result from FIG. 7, this demonstrates a 60.67 dB difference between the fundamental tone, at 0 dB (ΔMKR reading) and the second harmonic, which is an undesired spur at −60.67 dB (ΔMKR). This should be compared to the same sine wave tone without shaped noise injection in FIG. 3 graph 50.

Figure 9:
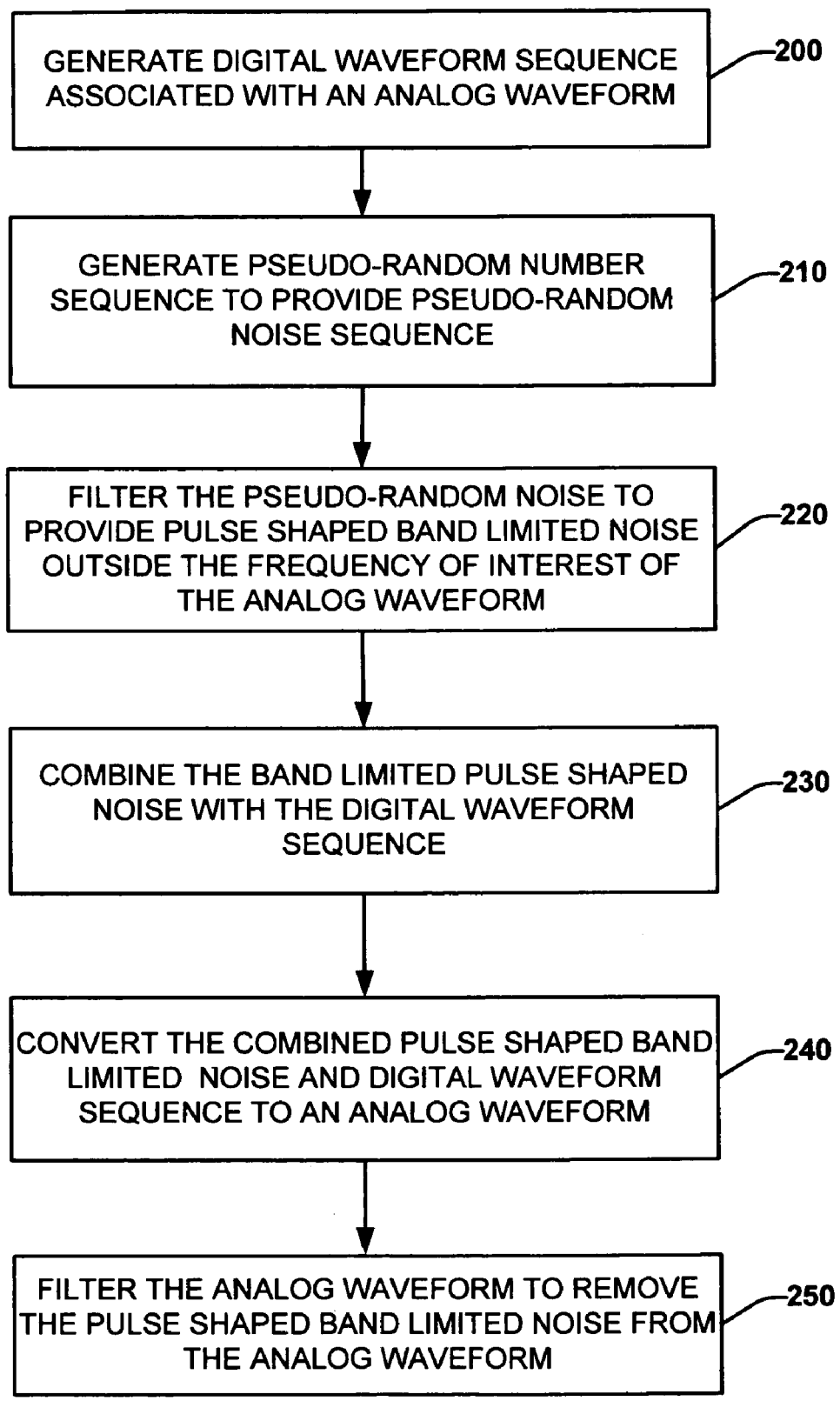
FIG. 9 illustrates a methodology for improving linearity of a DAC in accordance with an aspect of the present invention.

In view of the foregoing structural and functional features described above, a methodology in accordance with various aspects of the present invention will be better appreciated with reference to FIG. 9. While, for purposes of simplicity of explanation, the methodology of FIG. 9 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 9 illustrates a methodology for improving linearity of a DAC in accordance with an aspect of the present invention. The methodology begins at 200 where a digital waveform sequence associated with an analog waveform is generated. At 210, a pseudo-random number sequence is generated to provide a pseudo-random noise sequence. At 220, the pseudo-random noise sequence is filtered to provide a pulse shaped band limited noise band that is outside a desired frequency of interest of the analog waveform. At 330, the pulse shaped band limited noise sequence is combined with the digital waveform sequence, for example, by adding via a summer. At 240, the combined band limited pulse shaped noise sequence and digital waveform sequence is converted into the analog waveform via a DAC. At 250, the analog waveform is filtered to remove the band limited pulse shaped noise portion along with DC and other spectral aliases from the analog waveform.

Figure 10:
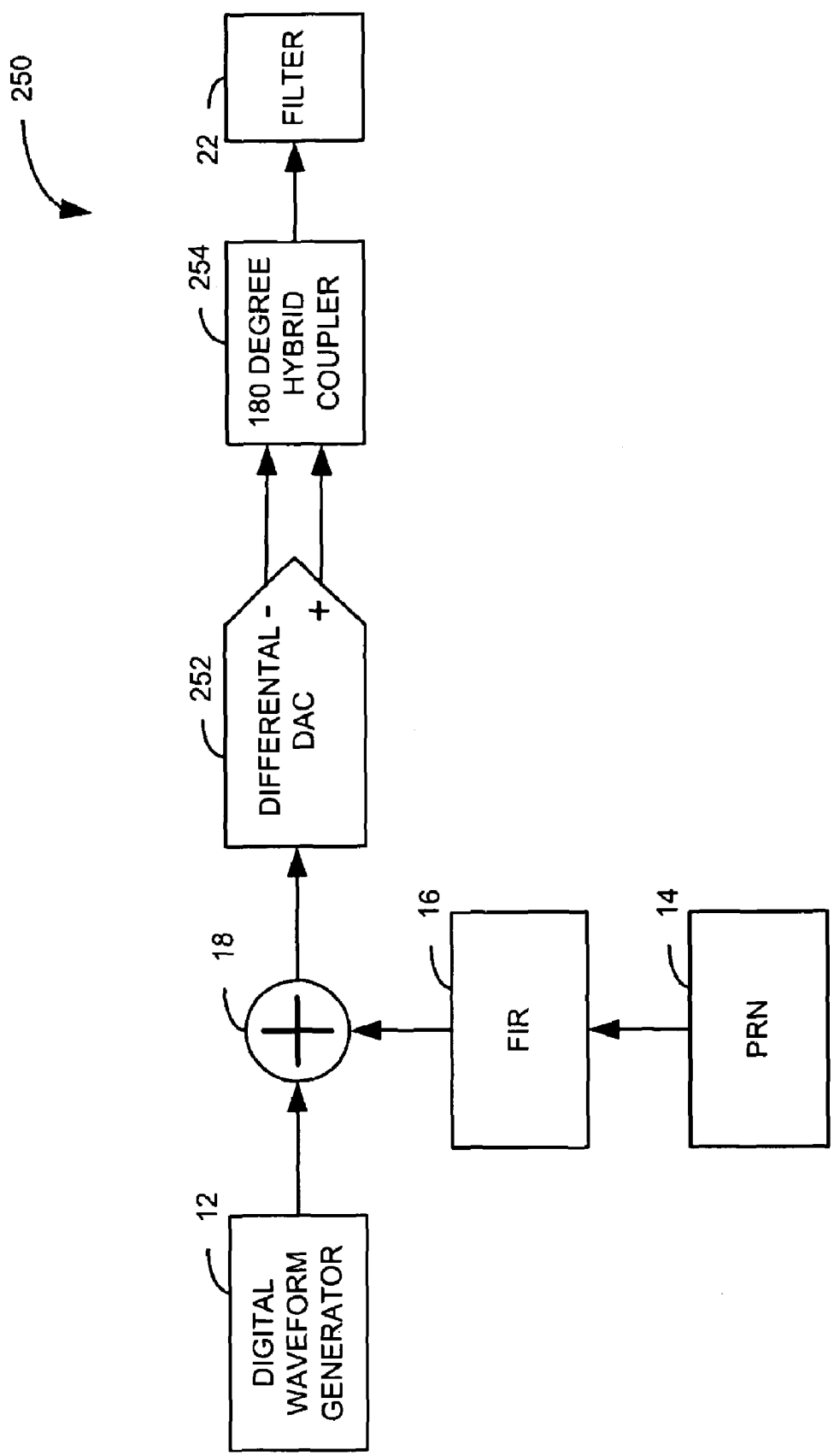
FIG. 10 illustrates one example of a system for improving linearity of a DAC in accordance with an aspect of the present invention.

FIG. 10 illustrates one example of a system 250 for improving linearity of a DAC in accordance with an aspect of the present invention. The illustrated implementation is substantially similar to FIG. 1, but the DAC 20 of FIG. 1 has been replaced with a differential DAC 252. The differential outputs of the differential DAC 252 are provided to a 180 degree hybrid coupler 254 that combines the differential outputs to a single-ended signal. This introduces a high pass response to the signal, partially removing the shaped noise. The output of the hybrid coupler 254 is then provided to a filter 22, just as in FIG. 1.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for improving the linearity of a digital-to-analog converter (DAC), the system comprising:
   a digital waveform generator that generates a digital sequence associated with a desired analog waveform;
   a pseudo-random noise component that provides a pulse shaped band limited pseudo-random noise sequence that is in a frequency band outside a desired frequency of the analog waveform; and
   a combiner configured to combine the digital sequence and the pulse shaped band limited pseudo-random noise sequence and provide the combined sequence to the DAC, the DAC including a differential output and further comprising a 180° hybrid configured to combine the differential outputs of the DAC into a single ended signal, the 180° hybrid partially removing the noise in the analog waveform associated with the pulse shaped band limited pseudo-random noise sequence.

2. The system of claim 1, further comprising a filter configured to filter noise in the analog waveform associated with the pulse shaped band limited pseudo-random noise sequence and pass the desired frequency of the analog waveform.

3. The system of claim 1, wherein the analog waveform is a sine wave.

4. The system of claim 3, wherein the digital waveform generator comprises a phase accumulator and a sine look-up table.

5. The system of claim 1, wherein the combiner is a summer that continuously adds the digital sequence with the pulse shaped band limited pseudo-random noise sequence.

6. The system of claim 1, further comprising a filter configured to filter noise in the analog waveform associated with the pulse shaped band limited pseudo-random noise sequence and pass the desired frequency of the analog waveform.

7. The system of claim 1, wherein the pseudo-random noise component comprises:
   a pseudo-random number generator that generates a pseudo-random number sequence to provide a pseudo-random noise sequence; and
   a finite impulse response filter configured to filter the pseudo-random noise sequence and pass a pulse shaped band limited pseudo-random noise sequence.

8. The system of claim 1, wherein the pulse shaped band limited pseudo-random noise sequence is stored in a memory device and read from the memory device and combined with the digital sequence by the combiner.

9. The system of claim 1 wherein the pulse shaped band limited pseudo-random noise sequence is in a frequency band that is one of about DC and about one half (½) of a sampling frequency and the desired frequency of the analog waveform is at another portion of the useful spectrum.

10. A method for improving the linearity of reducing harmonic spurs from a Nyquist digital-to-analog converter (DAC), the method comprising:
   generating a digital sequence associated with a desired analog waveform;
   providing a pulse shaped band limited pseudo-random noise sequence in a frequency band outside a desired frequency of the analog waveform;
   combining the digital sequence and the pulse shaped band limited pseudo-random noise sequence;
   providing the combined sequence to the DAC, the DAC including a differential output;
   operating the DAC at a Nyquist frequency associated with the desired analog waveform;
   combining the differential outputs of the DAC into a single ended signal at a 180° hybrid; and
   partially removing the noise in the analog waveform associated with the pulse shaped band limited pseudo-random noise sequence at the 180° hybrid.

11. The method of claim 10, wherein providing a pulse shaped band limited pseudo-random noise sequence comprises:
   generating a pseudo-random number sequence to provide a pseudo-random noise sequence; and
   filtering the pseudo-random noise sequence to pass a pulse shaped band limited pseudo-random noise sequence.

12. The method of claim 10, further comprising filtering noise in the analog waveform associated with the pulse shaped band limited pseudo-random noise sequence to pass the desired frequency of the analog waveform.

13. The method of claim 10, wherein the pulse shaped band limited pseudo-random noise sequence is in a frequency band that is one of about DC and about one half (½) of a sampling frequency and the desired frequency of the analog waveform is at another portion of the useful spectrum.

14. The method of claim 10, wherein the combining the digital sequence and the pulse shaped band limited pseudo-random noise sequence comprises continuously adding the digital sequence with the pulse shaped band limited pseudo-random noise sequence.

* * * * *